United States Patent
Jo et al.

(10) Patent No.: US 9,202,855 B1
(45) Date of Patent: Dec. 1, 2015

(54) ORGANIC LIGHT EMITTING DISPLAY DEVICE INCLUDING LOW REFLECTIVE PANEL

(71) Applicant: LG DISPLAY CO., LTD., Seoul (KR)

(72) Inventors: EunMi Jo, Goyang-si (KR); JuneHo Park, Paju-si (KR); InCheol Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/582,706

(22) Filed: Dec. 24, 2014

(30) Foreign Application Priority Data

Aug. 14, 2014 (KR) ........................ 10-2014-0105890

(51) Int. Cl.
*H01L 33/00* (2010.01)
*H01L 27/32* (2006.01)
*H01L 29/786* (2006.01)
*H01L 27/146* (2006.01)

(52) U.S. Cl.
CPC ...... *H01L 27/3276* (2013.01); *H01L 27/14621* (2013.01); *H01L 27/322* (2013.01); *H01L 27/3211* (2013.01); *H01L 27/3213* (2013.01); *H01L 27/3258* (2013.01); *H01L 27/3272* (2013.01); *H01L 29/7869* (2013.01)

(58) Field of Classification Search
None
See application file for complete search history.

(56) References Cited

U.S. PATENT DOCUMENTS

| | | | |
|---|---|---|---|
| 2010/0195201 A1* | 8/2010 | Minoura et al. | 359/452 |
| 2011/0169869 A1* | 7/2011 | Wang et al. | 345/690 |
| 2012/0104430 A1* | 5/2012 | Kim et al. | 257/91 |
| 2012/0268698 A1* | 10/2012 | Wang et al. | 349/106 |
| 2013/0271690 A1* | 10/2013 | Matsukizono | 349/46 |

* cited by examiner

*Primary Examiner* — Reema Patel
(74) *Attorney, Agent, or Firm* — Birch, Stewart, Kolasch & Birch, LLP

(57) ABSTRACT

A display panel is discussed. The display panel includes a substrate having a thin film transistor (TFT) area having a plurality of thin film transistors (TFTs), and a pixel area having a plurality of subpixels that correspond to the plurality of thin film transistors; a plurality of color filters respectively formed in each area of the plurality of subpixels, the plurality color filters comprising each of red color (R), green color (G), blue color (B) and white color; and a white photoresist formed in a subpixel area of the white color filter, and formed to cover the TFT area.

15 Claims, 14 Drawing Sheets ic LIGHT EMITTING DISPLAY DEVICE INCLUDING LOW REFLECTIVE PANEL

CROSS-REFERENCE TO RELATED APPLICATION

This application claims priority from and the benefit under 35 U.S.C. §119(a) of Korean Patent Application No. 10-2014-0105890, filed on Aug. 14, 2014, which is hereby incorporated by reference for all purposes as if fully set forth herein.

BACKGROUND OF THE INVENTION

1. Field of the Invention

The embodiment of the invention relates to an organic light emitting display device including a low reflective panel.

2. Description of the Prior Art

As the information society develops, display devices for displaying an image are being increasingly required in various forms, and in recent years, various display devices such as Liquid Crystal Displays (LCDs), Plasma Display Panels (PDPs), and Organic Light Emitting Display Devices (OLEDs) have been utilized. In such various display devices, a display panel suitable for a corresponding display device is included therein.

The display panel included in the display device may be one of various display panels made from one substrate. That is, elements, signal lines, or power lines configuring pixels in one substrate are formed in a unit of display panels according to several process procedures, and then a substrate is cut in a unit of display panels using scribing equipment to produce several display panels.

In addition, the display panel includes a plurality of thin film transistors and pixel areas controlled by the thin film transistors. Incident light input from the outside of a display panel is reflected by elements such as a line configuring a display device and output to the outside of the display device. This may overlap an image output from the display device, and degrade a quality of the image. Therefore, a technique for reducing a reflection of the incident light is necessary.

SUMMARY OF THE INVENTION

According to an embodiment of the invention, a display panel includes a substrate having a thin film transistor (TFT) area having a plurality of thin film transistors (TFTs), and a pixel area having a plurality of subpixels that correspond to the plurality of thin film transistors; a plurality of color filters respectively formed in each area of the plurality of subpixels, the plurality color filters comprising each of red color (R), green color (G), blue color (B) and white color; and a white photoresist formed in a subpixel area of the white color filter, and formed to cover the TFT area.

According to another embodiment of the invention, a display panel includes a plurality of data lines and a plurality of gate lines; a thin film transistor having a source electrode and a drain electrode, and formed at an intersection of at least one of the plurality of data lines and at least one of the plurality of gate lines; a non-transparent photoresist positioned on the thin film transistor; a white pixel electrode connected to the source electrode or the drain electrode of the thin film transistor and positioned in a white subpixel area where the non-transparent photoresist is positioned, wherein the white pixel electrode faces the white subpixel area; and a non-white pixel electrode connected to the source electrode or the drain electrode of the thin film transistor and positioned in a non-white subpixel area where one of red, green and blue photoresists is positioned, wherein the non-white pixel electrode face the non-white subpixel area.

BRIEF DESCRIPTION OF THE DRAWINGS

The above and other objects, features and advantages of the embodiment of the invention will be more apparent from the following detailed description taken in conjunction with the accompanying drawings, in which.

DETAILED DESCRIPTION OF THE EMBODIMENTS

Figure 1:
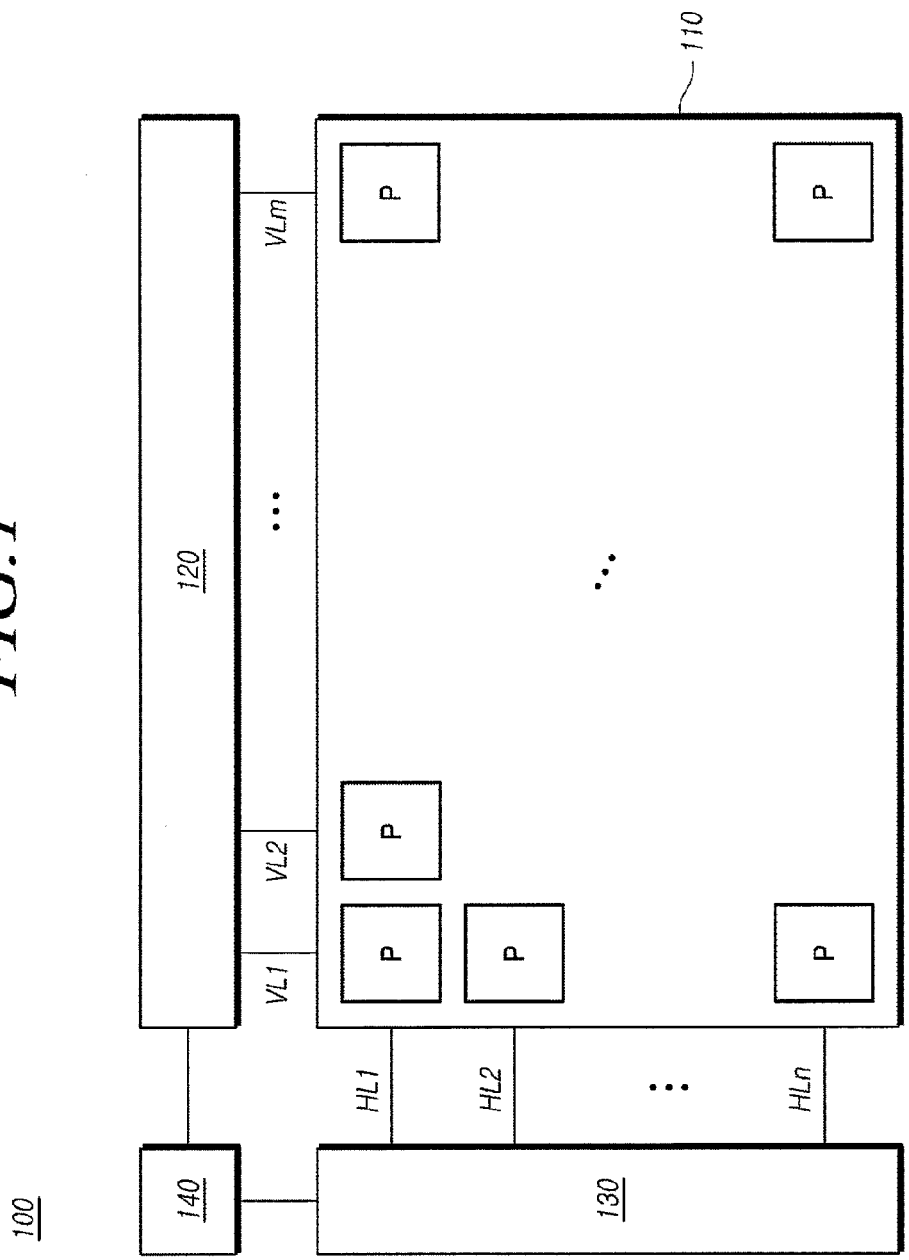
FIG. 1 is a schematic view illustrating a display device according an embodiment of the invention.

Hereinafter, embodiments of the invention will be described with reference to the accompanying drawings. In the following description, the same elements will be designated by the same reference numerals throughout even when they are shown in different drawings. Further, in the following description of the embodiment of the invention, a detailed description of known functions and configurations incorporated herein will be omitted when it is deemed such redundant detailed description obscures the subject matter of the embodiment of the invention.

In addition, terms, such as first, second, A, B, (a), (b) or the like may be used herein when describing components of the embodiment of the invention. Each of these terminologies is not used to define an essence, order or sequence of a corresponding component but used merely to distinguish the corresponding component from other component(s). In the instance that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a schematic view illustrating a display device according an embodiment of the invention.

Referring to FIG. 1, the display device 100 according to embodiments includes a display panel 110 in which a plurality of first lines VL1 to VLm are formed in a first direction (for example, a vertical direction) and a plurality of second lines HL1 to HLn are formed in a second direction (for example, a horizontal direction), a first driving unit 120 for supplying a first signal to the plurality of first lines VL1 to VLm, a second driving unit 130 for supplying a second signal to the plurality of second lines HL1 to HLn, and a timing controller 140 for controlling the first driving unit 120 and the second driving unit 130.

A plurality of pixels P are defined in the display panel 110 as the plurality of first lines VL1 to VLm formed in the first direction (for example, a vertical direction) and the plurality of second lines HL1 to HLn formed in the second direction (for example, a horizontal direction) cross each other.

Each of the above-mentioned first driving unit 120 and second driving unit 130 may include at least one driving integrated circuit outputting a signal for an image display.

The plurality of first lines VL1 to VLm formed in the display panel 100 in the first direction may be, for example, data lines formed in the vertical direction (first direction), for transferring a data voltage (first signal) to vertical rows of pixels, and the first driving unit 120 may be a data driving unit for supplying a data voltage to the data lines.

In addition, the plurality of second lines HL1 to HLn formed in the display panel 110 in the second direction may be gate lines formed in the horizontal direction (second direction), for transferring a scan signal (first signal) to horizontal rows of pixels, and the second driving unit 130 may be a gate driving unit for supplying a scan signal to the gate lines.

In addition, a pad part is configured in a display panel 110 in order to access the first drive unit 120 and the second drive unit 130. The pad part transfers the first signal to the display panel 110 when the first drive unit 120 provides the first signal to the plurality of first lines VL1 to VLm. In the same manner, the pad part transfers the second signal to the display panel 110 when the second drive unit 130 provides the second signal to the plurality of second lines HL1 to HLn. Therefore, the pad part may be formed in a process of forming an area of the pixels in the display panel 110.

Hereinafter, an area where a color filter is formed or not formed in a panel is referred to as a pixel area. The pixel area includes n number of subpixel areas. For example, the pixel area may include a white subpixel area, a red subpixel area, a green subpixel area and a blue subpixel area. In each subpixel area, a color filter for displaying a specific color may be formed. That is, each area where one type of color filter is deposited is referred to as the subpixel area. In addition, an electrode formed in each subpixel area is referred to as a pixel electrode. A subpixel area where an RGB (red, green and blue) color filter is formed may be referred to as a non-white subpixel area.

Meanwhile, a display device using an organic light emitting device, among display devices such as the display device of FIG. 1, may employ a polarizing plate or a polarizing film for blocking reflection by each electrode part.

Figure 2:
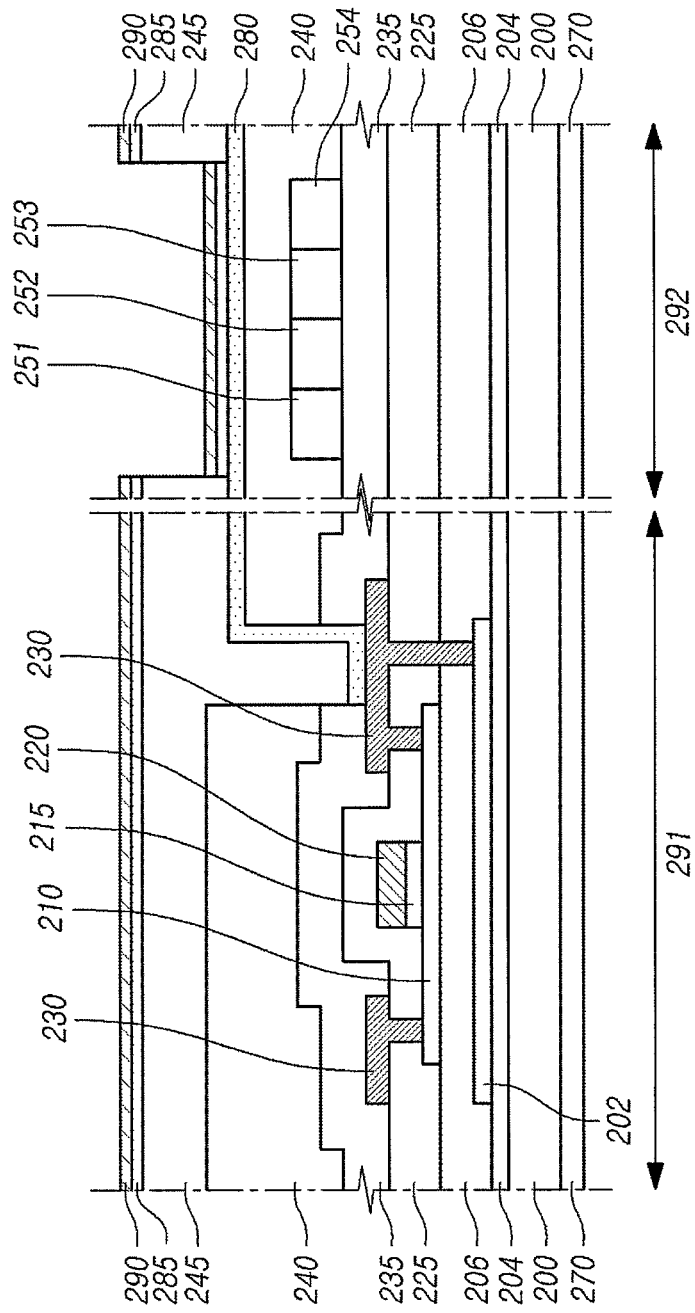
FIG. 2 is a view illustrating a part of a display panel with which a polarizing plate is combined.

FIG. 2 is a view illustrating a part of a display panel with which the polarizing plate is combined.

In a Thin Film Transistor (TFT) area 291 on a substrate 200, a light shield layer 202, buffer layers 204 and 206, an active layer 210, a gate insulating layer 215, a gate 220 and an InterLayer Dielectric (ILD) 225 are formed. Since a portion of the ILD is etched, the active layer 210 is exposed, and the exposed active layer 210 contacts with a source/drain electrode 230. In addition, a passivation layer 235, an overcoat layer 240 and a bank 245 are formed. Meanwhile, in a subpixel area 292, a pixel electrode (or an anode electrode) 280, an organic layer 285 are formed. A cathode electrode 290 is positioned on the organic layer 285. The red, green and blue color filters are formed in subpixel areas 251, 253 and 254 where the RGB color filters are formed, respectively. An additional color filter is not formed in a white pixel area 252. In FIG. 2, the white subpixel area 252 is shown as a quadrangle, and the overcoat layer 240 is deposited on the white subpixel area 252. Furthermore, a polarizing plate 270 is formed in a lower portion of the substrate 200.

The structure of FIG. 2 may limit a reflection characteristic of incident light (i.e. external light) input from surroundings. However, luminance efficiency and lifetime of a display device are reduced due to low transmittance of the polarizing plate or the polarizing film.

For convenience of description, FIG. 2 illustrates all of four subpixels in the pixel area 292, and the four subpixels may divide the organic light emitting layer 285 by banks. Also, one pixel electrode 280 may be formed in each of the Red, White, Green and Blue (RWGB) areas 251, 252, 253 and 254, and the formed pixel electrodes 280 may be connected to pixel electrodes 280 in the TFT area 291.

Figure 3:
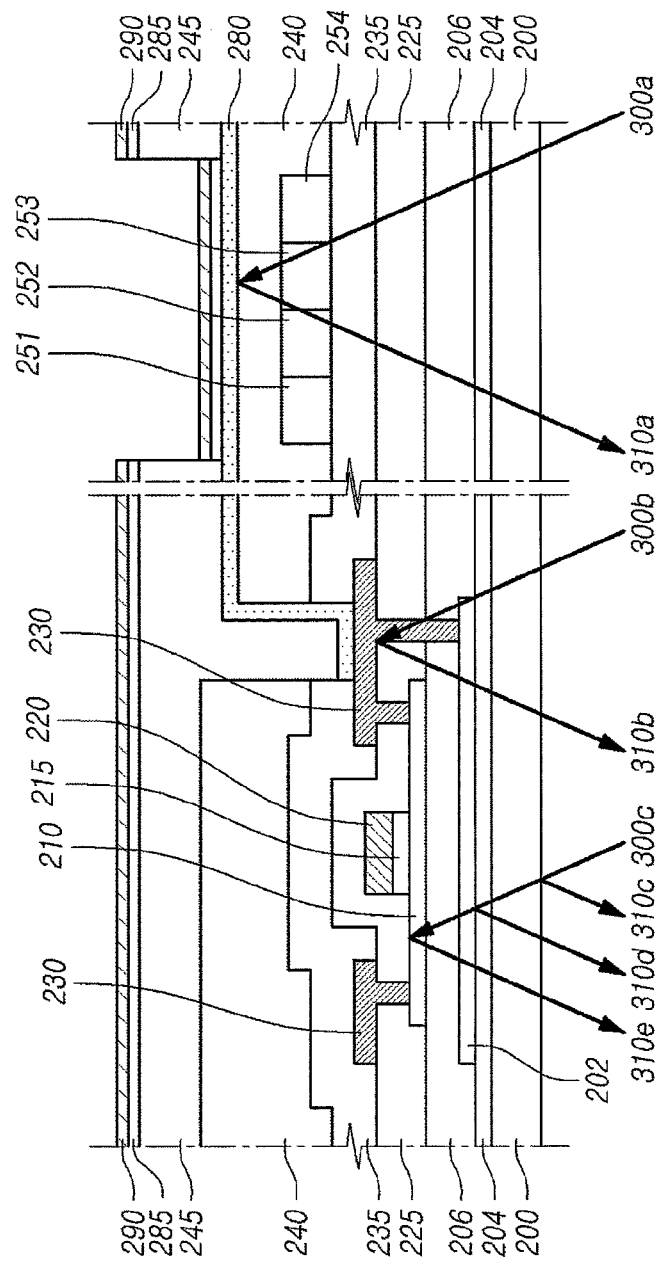
FIG. 3 is a view illustrating reflection of light when the polarizing plate is removed in the display panel shown in FIG. 2.

FIG. 3 is a view illustrating reflection of light when the polarizing plate is removed in the display panel shown in FIG. 2.

Incident light 300a, 300b and 300c input from the outside are reflected as indicated by reference numerals 310a, 310b, 310c, 310d and 310e due to a characteristic of metal material of the pixel electrode 280, the source/drain electrode 230, the active layer 210 and the gate 220. In addition, since a color filter is not formed in the white subpixel area 252, reflectance of the external light, which is reflected by the pixel electrode 280, in the white subpixel area 252 is higher than that of the external light in the RGB areas 251, 253 and 254. The incident light 300a, 300b and 300c input from the outside are non-polarized light. The non-polarized light is reflected in the TFT area of the white subpixel area, and is output to the outside of the display panel.

When an oxide TFT is employed in the display panel, in order to block light input to a TFT, a light shield layer (e.g., material such as MoTi) may be patterned under a TFT channel. For example, the light shield layer may be deposited and patterned under the gate, source and drain electrodes. The TFT area may be referred to as a non-opening portion. An area where light emits to the outside of the display panel may be referred to as a pixel area or an opening portion. The opening portion forms a color filter having a specific color (e.g., red, green and blue, hereinafter, referred to as R, G and B, respectively). The pixel electrode is formed with ITO and the like to face the color filter, and a white OLED and the cathode electrode are deposited to configure the display panel. In this process, there are problems wherein the display panel reflects the external light. Therefore, in order to improve visibility, that is, reduce the reflection of the external light, the polarizing plate or the polarizing film is attached as illustrated in FIG. 2 to induce the low reflection of the external light. That is, since a line, an electrode and the like reflect light, the polarizing plate or the polarizing film is attached. The polarizing plate or the polarizing film reduce transmittance of light generated from the light emitting device in the display panel, thereby reducing luminance efficiency and lifetime of the display panel. However, when the polarizing film or the polarizing film is removed as shown in FIG. 3, since visibility is reduced due to the reflection of the external light, a technique for absorbing the external light and increasing light transmittance of the display panel is necessary. In the embodiment of the invention, a technique is disclosed wherein a light controlling film including a light absorbing layer is deposited on a display panel for absorption and low reflection of external light and a white PhotoResist (PR) is deposited in an opening portion and a non-opening portion for low reflection of the external light which is a non-polarized light in a line area. The white PR is one embodiment of a non-transparent photoresist. A non-transparent photoresist which does not transmit a part of light but transmits light having a wavelength range wider than that of light (i.e, red, green and blue light) transmitted by the RGB color filers is referred to as a white photoresist or a white PR, as a light red, a light blue, a light green or other light colors of photoresist.

That is, the embodiments of the invention are embodiments for reducing reflectance of a panel by depositing the white photoresist which is the non-transparent photoresist in a reflective area such as a line and an electrode of an opening portion and a non-opening portion in the white subpixel area and attaching the light transmittance controlling film in order to reduce the reflectance of the external light.

Figure 4:
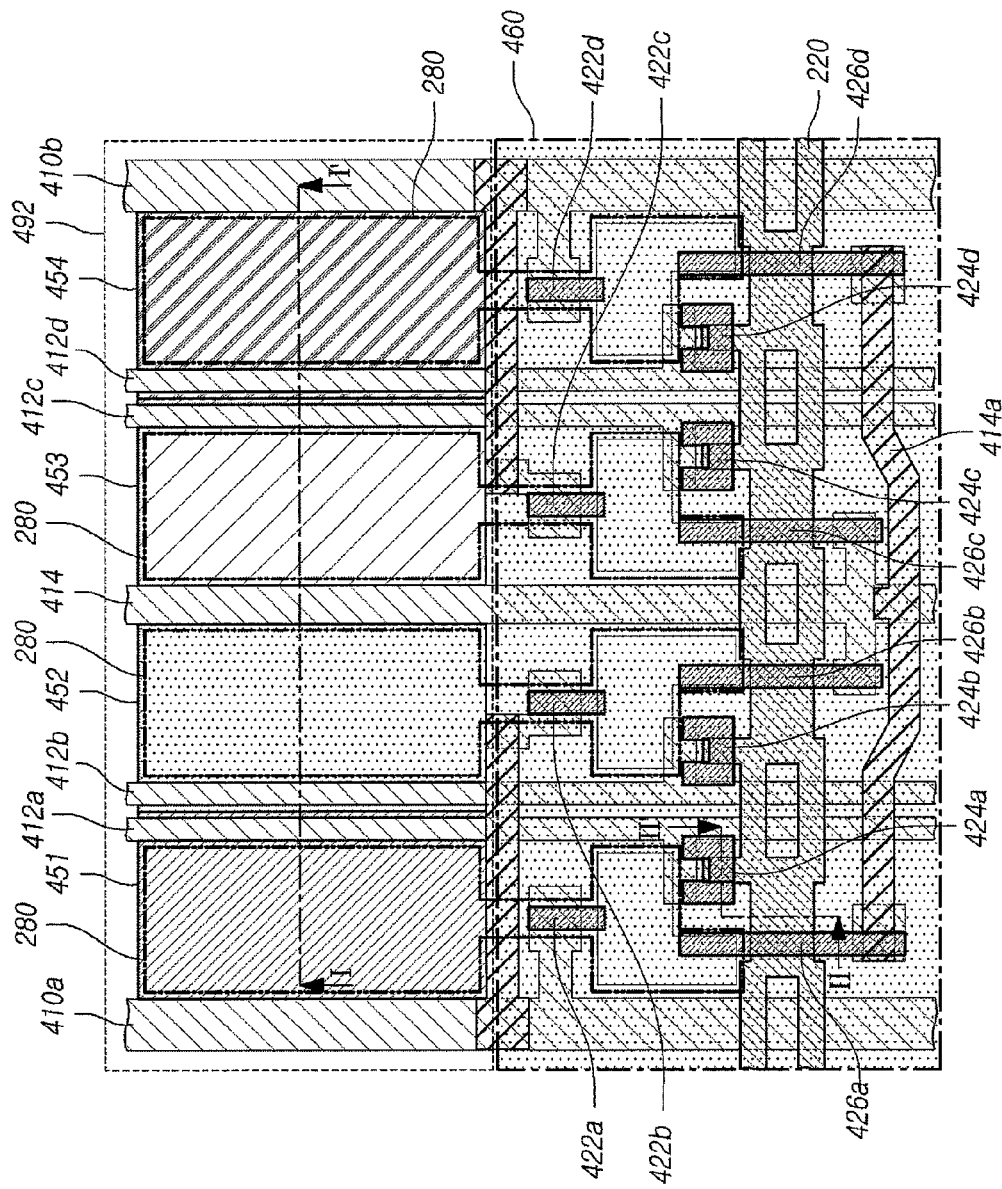
FIG. 4 is a view illustrating a white subpixel area and a non-white subpixel area according to an embodiment of the invention.

FIG. 4 is a view illustrating the white subpixel area and a non-white subpixel area according to an embodiment of the invention. FIG. 4 shows WRGB subpixel areas including the white subpixel employing the W-PR according to an embodiment of the invention. The subpixel areas are included in one pixel area 492. The pixel electrode 280 is formed on each subpixel area, and the color filters are formed under the pixel electrode in the subpixel area. The color filters 451, 452, 453 and 454 are formed in the subpixel area.

Each of the color filters faces the pixel electrode 280. The red color filter 451, the blue color filter 453 and the green color filter 454 are formed and the white PR 452 is formed in the white subpixel area, and these color filters 451, 452, 454 and white PR 452 face an area where light emits due to emission of an organic light emitting device not shown in FIG. 4 by the pixel electrode 280. The pixel electrode 280 facing each of the color filters and the white photoresist may be an anode electrode. An organic light emitting layer is formed between the pixel electrode facing each of the color filters and the white photoresist, and a cathode electrode facing one or more pixel electrodes.

Transistors controlling each of the pixel electrodes include driving transistors 422a, 422b, 422c and 422d connected to VDDs 410a and 410b, switching transistors 424a, 424b, 424c and 424d connected to data lines 412a, 412b, 412c and 412d, and sensing transistors 426a, 426b, 426c and 426d connected to a Vref 414. An element indicated as reference numeral 414a transfers the Vref to the sensing transistors 426a and 426d. The transistors form a non-opening portion, include a metal line, an electrode or the like, and reflect external light in a structure where a polarizing plate or a polarizing film is not included. In order to reduce reflectance of the external light in the TFT area, a white photoresist 460 is spread. This may be formed with a material identical to that of a white photoresist 452 formed in the white subpixel area, and may be formed in a process identical to a process forming the white photoresist 452, thereby reducing processing and manufacturing cost.

Since the embodiment of the invention is not limited to a specific transistor structure, a different structure of transistor or a different type of transistor compared to the transistor in FIG. 4 may be employed in driving the pixel electrode and the thin film transistor.

In order to reduce high reflectance of the white subpixel area and the TFT, the embodiment of the invention palely coats the non-transparent color photo resist in the white subpixel area, the coated non-transparent color photo resist plays a role of a color filter to reduce transmittance of reflected light. In addition, the color photoresist, which is the same material, is formed on the TFT, thereby low-reflecting the external light in a whole of the display panel. Meanwhile, as another embodiment for reducing the reflection of the external light, a film including a light absorbing layer is deposited in the display panel. Therefore, the external light is absorbed in the film and the reflected light is also absorbed in the film. The absorption ratio of the light emitted from the organic light emitting layer and absorbed in the film is lower than that of the light absorbed in the polarizing plate or the polarizing film, thereby providing both of the light efficiency and low reflection efficiency.

The non-transparent photoresist of the embodiment of the invention includes a material playing a role of a color converting layer identical to a color filter, the material forms color filters of red, green and blue colors corresponding to RGB according to the prior art, and the material transmits colors lighter than the red, green and blue colors. The light color may include a wavelength band wider than that of the color filter according to the prior art, or may refer to a characteristic of a material transmitting high luminance of light. This will be described with reference to FIGS. 11 and 12.

In an embodiment of the invention, light emitted in the white subpixel area has a color as white as possible, and in order to reduce the reflection of the external light, a color filter having a light color is formed in the white subpixel area. In addition, in an embodiment of the invention, a color filter including red, green or blue wavelength range and having high transmittance is formed in the white subpixel area. Since the transmittance is high, a much wider wavelength band of light is transmitted, and thus light red, light green or light blue may be included in the white subpixel area.

Hereinafter, a white photoresist, which has a color lighter than that of the red color filter and transmits more light compared to the red color filter, is referred to as a reddish white photoresist, a white photoresist, which has a color lighter than that of the blue color filter and transmits more light compared to the blue color filter, is referred to as a bluish white photoresist, and a white photoresist, which has a color lighter than that of the green color filter and transmits more light compared to the green color filter, is referred to as a greenish white photoresist.

However, the white photoresist of the embodiment of the invention is not limited to the above-mentioned colors. That is, the white photoresist of the embodiment of the invention includes all types of photoresists, which has a non-transparent color for the low reflection and transmits wider wavelength band of light, that is, a larger amount of light, compared to a photoresist for a color filter formed in the non-white subpixel area.

In summary, in FIG. 4, the RGB color filters 451, 453 and 454 are formed in each of the subpixel areas, the white photoresist is formed in the white subpixel area, and the white photoresist 460 is also formed even in the line area of the non-opening portion. The white photoresist transmits the light, such as the light red, light blue and light green light of which transmittance is higher and wavelength band is wider than light transmitted by the RGB color filters. In addition, the white photoresist is also formed in the non-opening portion so as to reduce the reflection of the external light in a wire and an electrode.

In addition, when the film including the light absorbing layer is deposited on the display panel, part of light transmitted through the film is absorbed in the light absorbing layer and does not reach the line/electrode of the TFT or the pixel electrode in the white subpixel area, thereby increasing a low reflection effect of the external light. In addition, a material for the low reflection may be deposited on the wire and electrode in the non-opening portion. This will be described later. The material for the low reflection may be deposited on all of the source electrode, the drain electrode, the gate, the light shield layer, the data and the like. The material of the line/electrode may be formed with dual or multiple layers together with the material of the low reflection.

Figure 5:
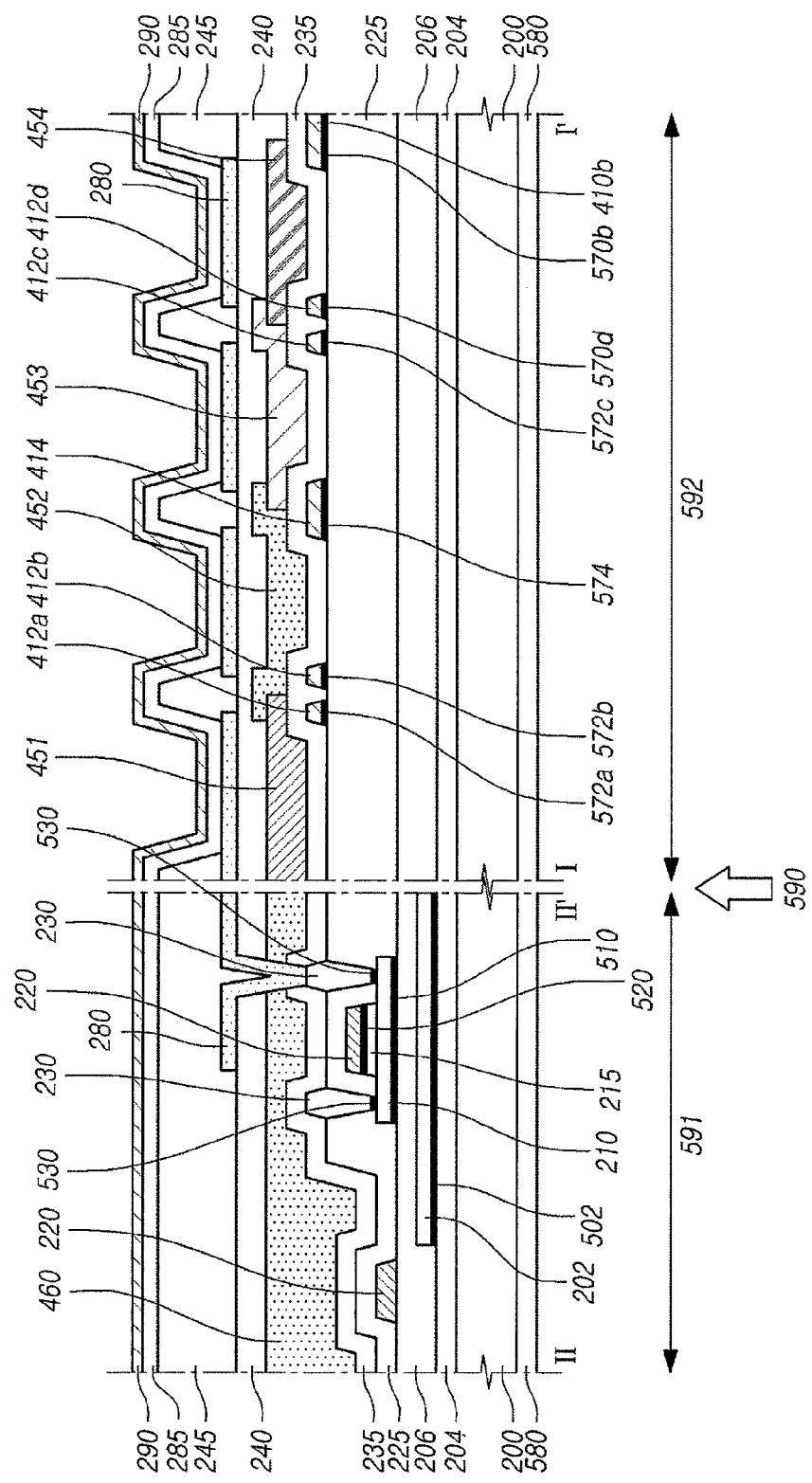
FIG. 5 is a view illustrating a thin film transistor area and a white subpixel area in which a white photoresist is formed according to an embodiment of the invention.

FIG. 5 is a view illustrating the thin film transistor area and the white subpixel area in which the white photoresist is formed according to an embodiment of the invention. FIG. 5 illustrates cross sections taken along a line I-I' of a pixel area and a line II-II' of the TFT area in FIG. 4. The panel includes the white photoresist and a film 580 including the light absorbing layer. The film of an embodiment may be a light transmittance controlling film.

A configuration of the transistor or the line may vary according to a characteristic of an organic light emitting display device. A TFT area 591 on the substrate 200 is the same as the TFT area 291 in FIG. 2, and therefore descriptions of the same part will be omitted. The white photoresist is formed in the TFT area 591. The red color filter 451, the blue color filter 453 and the green color filter 454 are formed in the pixel area 592. In addition, the white photoresist 452 is formed in the white subpixel area. In FIG. 5, the film 580 including the light absorbing layer is additionally combined with the substrate 200, thereby increasing absorption of the incident external light and the reflected external light. The film 580 controls transmittance of light, thereby controlling transmittance of the light emitted from the organic light emitting device and reflectance of the external light. For example, the film 580 may be a light controlling film, but is not limited thereto.

As shown in FIG. 5, in order to reduce the reflectance of the external light, which is increased as a result of the removal of the polarizing plate, high refraction of color photoresists (i.e. the non-transparent photoresists) 452 and 460 are palely coated in the non-opening portion, and simultaneously, the light transmittance controlling film having a reflection-prevention function is attached on a whole surface of the panel, thereby absorbing light selectively and reducing the reflectance of the whole panel.

Meanwhile, the low reflective material is spread on the electrode, the gate and the lines between the subpixel areas in the TFT area 591. That is, a low reflective material 502 is formed under the light shield layer 202, a low reflective material 510 is formed under the active layer 210, and a low reflective material 520 is formed under the gate 220. In addition, a low reflective material 530 is formed also under the source/drain electrodes 230. Furthermore, low reflective materials 572a, 572b, 572c, 572d, 574 and 570b are formed also on lines 412a, 412b, 412c, 412d, 414 and 410b between the subpixel areas.

In summary, the display panel and the display device including the same disclosed in the embodiment of the invention based on the structure of FIG. 5 are as follows.

The display panel includes the plurality of data lines and the plurality of gate lines, the thin film transistor formed due to an intersection of the data line and the gate line, wherein a non-transparent photoresist is positioned the thin film transistor, a white pixel electrode connected to a source electrode or a drain electrode of the thin film transistor and positioned in a white subpixel area where the non-transparent photoresist is positioned, wherein the white pixel electrodes face each white subpixel area, and a non-white pixel electrode connected to the source electrode or the drain electrode of the thin film transistor and positioned in a non-white subpixel area where one of red, green and blue photoresists is positioned, wherein the non-white pixel electrodes face each non-white subpixel area. The non-transparent photoresist reduces the reflection of the external light. In addition, the display device further includes the data driving unit driving the plurality of data lines, the gate drive unit driving the plurality of gate lines, and the film attached to the display panel and including the light absorbing layer, which absorbs the external light, in addition to the display panel.

The non-transparent photoresist of the display panel and the film combined with the display panel provide an effect of reducing the reflectance of the external light reflected to the outside from the panel. Especially, the non-transparent photoresist reduces the reflection of the external light due to the cathode electrode in the white subpixel area, thereby increasing visibility of the display panel. Furthermore, the light absorbing layer included in the film provides an effect of absorbing both the reflected external light and the incident external light.

Figure 6:
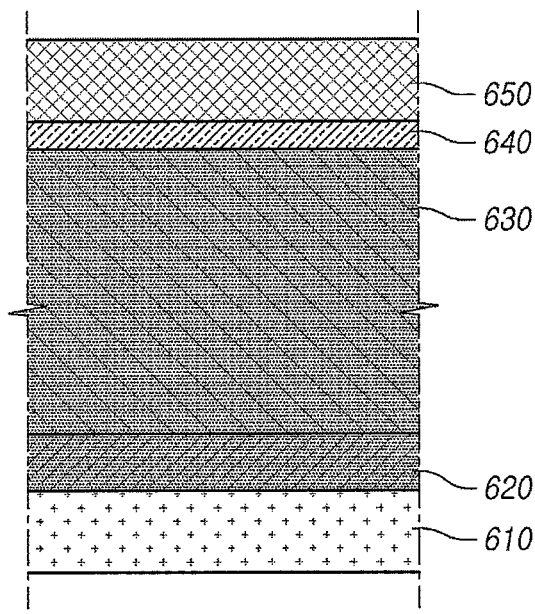
FIG. 6 is a view illustrating a structure of a film including a light absorbing layer according to an embodiment of the invention.

FIG. 6 is a view illustrating a structure of the film including the light absorbing layer according to an embodiment of the invention. The film may include multi-layer of various materials, and the material of the multi-layer may further include the light absorbing layer. Examining a cross section of the film 580, the film 580 includes two films (i.e., a first film and a second film) in more detail, and multiple layers or materials included between the first film and the second film. The film 580 may include a release film 610, an adhesive 620, a supporting layer 630, a material 640 (e.g., AntiReflective (AR)) for a surface treatment, which are an embodiment of the first film, and a protection film 650 which is an embodiment of the second film. But, the embodiment of the invention is not limited thereto. That is, specific material or a specific layer may be removed or added according to a characteristic of the display panel or a characteristic of the display device. The film 580 of FIG. 6 may include a light absorbing material. More specifically, the light absorbing material may be included in the adhesive 620 or the supporting layer 630.

The light absorbing material included in the adhesive 620 or the supporting layer 630 positioned between the two films absorbs the external light, and when the external light input to the display panel is reflected, enables the reflected light to be absorbed in the light absorbing material again. Such an absorbing process is illustrated in detail in FIG. 8.

The light absorbing layer may be one of a material including nano particles, a non-transparent dye material and a photoresist material, but is not limited thereto, and includes all materials having a characteristic of absorbing the incident external light or the reflected external light. When the nano particles are included, the incident light or the reflected light is scattered, thereby providing a low reflection effect. In an instance of the photoresist or a dye material, the light absorbing layer may have a light color identically to the above-mentioned non-transparent photoresist, thereby providing a low reflection effect of the external light in a principle equal to that of reducing the reflection of the cathode electrode in the RGB subpixel areas where the color filter is formed. In this instance, a photoresist which does not change a color of the color filter and does not have an effect on visibility may be formed in the adhesive 620 or the supporting layer 630 as the light absorbing material. Here, the photoresist may have a gray or a light white in consideration of the color of the color filter. The supporting layer of the film in the embodiment of the invention may include all materials including PolyEthylene Terephthalate (PET) and Tri-Acetyl Cellulose (TAC).

In an embodiment, the film 580 of FIG. 6 is the light transmittance controlling film, and a light absorbing material which controls the light transmittance in an adhesive portion of the film 610 of which a surface is a reflection-prevention treated. Of course, any layer among various layers may include the light absorbing material.

Figure 7:
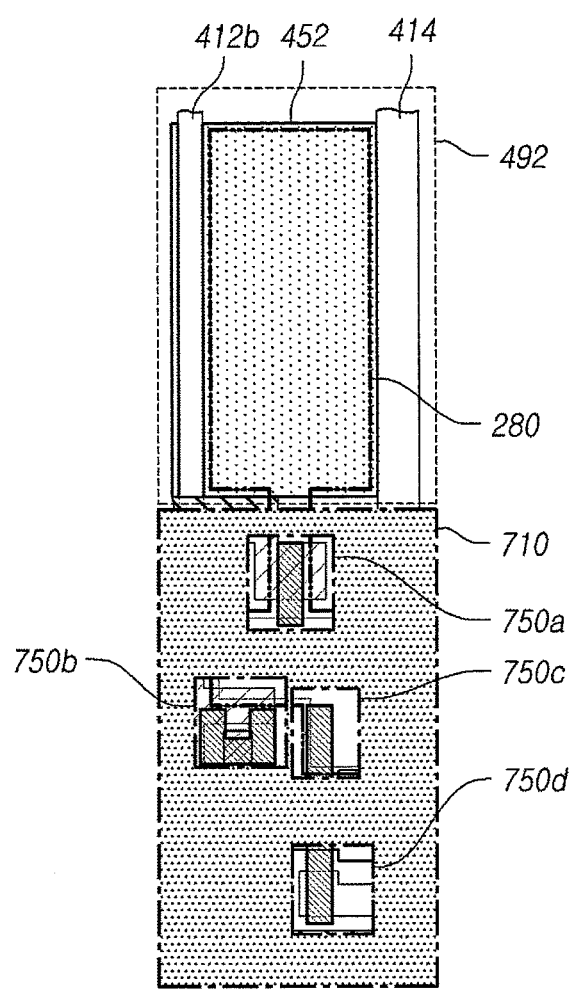
FIG. 7 is a view illustrating low reflective material deposited for low reflection of external light according to an embodiment of the invention.

FIG. 7 is a view illustrating the low reflective material deposited for the low reflection of the external light according to an embodiment of the invention. Examining FIG. 5 in a direction indicated by reference numeral 590, a low reflective material 710 is spread in the TFT area. In some contact holes, the low reflective material 710 is spread and etched, and thus the low reflective material 710 may be removed as indicated by reference numerals 750a, 750b, 750c and 750d. However, the embodiment of the invention is not limited thereto, and includes an instance wherein the low reflective material is spread on a whole surface.

The low reflective material prevents the reflection of the external light of non-polarized light, which may be reflected by the electrode or the line in the TFT area.

When the polarizing plate/polarizing film is removed, since the reflectance of the external light in the TFT area increases, in order to reduce the reflectance, a low reflective metal is deposited in the TFT area or a light shield layer in the TFT area, thereby reducing the reflection of the external light reflected by the metal portion of the electrode. The low reflective material 710 may be spread on the line part in the TFT area, as a part of the bottom surface of the structure in FIG. 4. For example, the low reflective metal may include a low reflective metal material such as MoTi, MoOx, Ti, TiOx and CuSix, but the embodiment of the invention is not limited thereto.

Figure 8:
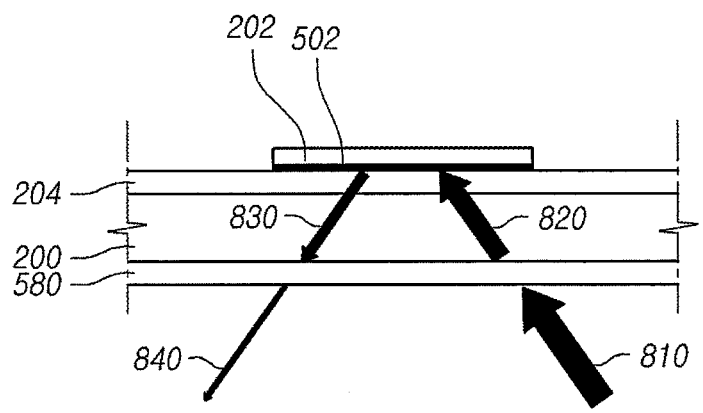
FIG. 8 is a view illustrating a light absorbing process in a film including a light absorbing layer which absorbs external light according to an embodiment of the invention.

FIG. 8 is a view illustrating a light absorbing process in the film including the light absorbing layer which absorbs the external light according to an embodiment of the invention. In FIG. 8, for convenience of description, the low reflection effect of the external light is provided by the film layer including the light absorbing layer and the low reflective material 502 formed under the light shield layer 202. The low reflective material may be deposited on all lines or electrodes such as the source electrode, the drain electrode, the gate, the data line, the gate line, the VDD line and the Vref line, as described with reference to FIG. 5.

In FIG. 8, when an external light 810 is input to the panel, the light absorbing layer 580 absorbs some parts of the external light, and other parts of the external light are transmitted as indicated by reference numeral 820. Only some parts of the transmitted external light are reflected as indicated by reference numeral 830 by the low reflective material 502. Meanwhile, the reflected light 830 is transmitted through the light absorbing layer 580 and some parts of the reflected light are absorbed in the light absorbing layer 580, and thus a very small amount of external light 840, compared to an initial incident external light 810, is output to the outside. That is, since only a very small amount of light is output to the outside of the display panel by the low reflective material 502 and the film 580 including the light absorbing layer, among the initial incident external light 810, visibility of the display panel in which a polarizing plate or a polarizing film is not included can be improved.

As illustrated in FIG. 8, when the electrode, the line or the light shield layer is formed with multiple layers on which the low reflective material is spread, the non-polarized light input from the outside is absorbed. Since several lines and electrodes forming the non-opening portion are formed with a metal, the reflectance of the external light is high. In the instance of the multi-layer structure formed with the low reflective material, since a mask which is employed in forming the line and the electrode may be used in forming the low reflective material, a processing cost can be reduced.

The low reflective material may include one of a light absorbing metal, a metal oxide including a metal and an alloy of metals, and this has an effect of maintaining an electrical mobility of line and electrode parts.

Figure 9A:
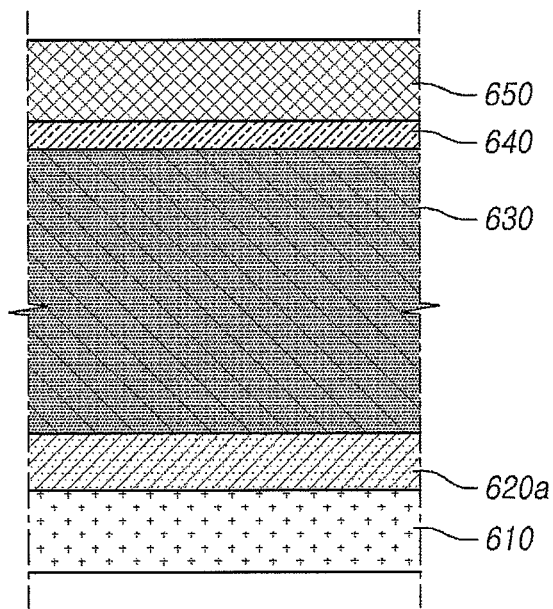
FIGS. 9A and 9B are cross-sectional views illustrating a film including dye for light absorption in an adhesive of the film according to an embodiment of the invention.
Figure 9B:
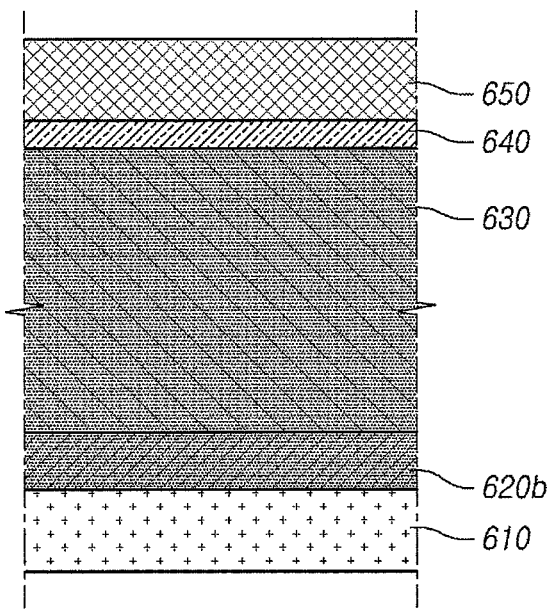

FIGS. 9A and 9B are cross-sectional views illustrating a film including a dye for absorbing light in an adhesive of the film according to an embodiment of the invention.

When the wavelength of the external light is 550 nm, the reflectance is as follows.

An adhesive 620a of FIG. 9A includes a compound of an adhesive and a dye for absorbing light. In FIG. 9A, transmittance of a whole film is 80%, and since 89.6% of incident external light is absorbed in a panel in which the light absorbing material included in the adhesive 620a and the white photoresist for the low reflection are combined, the reflectance becomes 10.4%.

An adhesive 620b of FIG. 9B includes a compound of an adhesive and a dye for absorbing light. In FIG. 9B, transmittance of a whole film is 70%, and since 91.3% of incident external light is absorbed in a panel in which the light absorbing material included in the adhesive 620b and the white photoresist for the low reflection are combined, the reflectance becomes 8.7%.

The adhesives 620a and 620b of FIGS. 9A and 9B include the light absorbing material, the light absorbing layer formed with the light absorbing material includes at least one of a material including nano particles, a non-transparent dye material and a photoresist material, and enables the incident external light or the reflected external light to be absorbed due to the material.

Figure 10A:
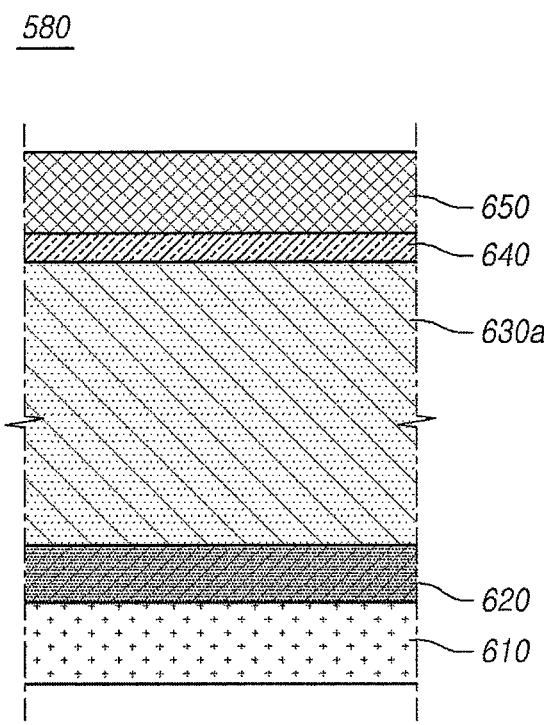
FIGS. 10A and 10B are cross-sectional views illustrating a film including the dye for light absorption in a supporting layer of the film according to an embodiment of the invention.
Figure 10B:
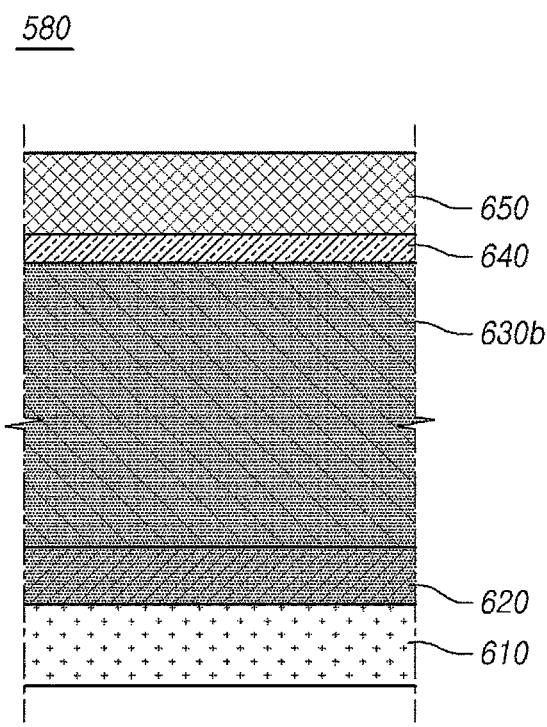

FIGS. 10A and 10B are cross-sectional views illustrating the film including the dye for light absorption in the supporting layer of the film according to an embodiment of the invention.

When the wavelength of the external light is 550 nm, the reflectance is as follows.

A supporting layer 630a of FIG. 10A includes a compound of the dye for absorbing light. In FIG. 10A, transmittance of a whole film is 75%, and since 90.7% of incident external light is absorbed in a panel in which the light absorbing material included in the supporting layer 630a and the white photoresist for the low reflection are combined, the reflectance becomes 9.3%.

An adhesive 630b of FIG. 10B includes a compound of the dye for absorbing light. In FIG. 10B, transmittance of a whole film is 70%, and since 91.4% of incident external light is absorbed in a panel in which the light absorbing material included in the supporting layer 630a and the white photoresist for the low reflection are combined, the reflectance becomes 8.6%.

The supporting layers 630a and 630b of FIGS. 10A and 10B include the light absorbing material, the light absorbing layer formed with the light absorbing material includes at least one of a material including nano particles, a non-transparent dye material and a photoresist material, and enables the incident external light or the reflected external light to be absorbed due to the material.

The supporting layer including the light absorbing material may include all materials including PolyEthylene Terephthalate (PET) and Tri-Acetyl Cellulose (TAC).

Table 1 shows the reflectance of the external light when the film including the light absorbing material according to various embodiments described with reference to FIGS. 9A to 10B is attached.

Case 1 is an instance of a display panel where a film is not attached and the white photoresist is formed. Case 2 is an instance wherein a film which does not include a light absorbing material is attached to a display panel including the white photoresist. Case 3 is an instance wherein a film of which transmittance is 80% is deposited on the display panel as illustrated in FIG. 9A, as an embodiment wherein the light absorbing material is included in the adhesive of the film which is deposited on the display panel including the white photoresist. Case 4 is an instance wherein a film of which transmittance is 70% is deposited on the display panel as illustrated in FIG. 9B, as an embodiment wherein the light absorbing material is included in the adhesive of the film which is deposited on the display panel including the white photoresist. Case 5 is an instance wherein a film of which transmittance is 75% is deposited on the display panel as illustrated in FIG. 10A, as an embodiment wherein the light absorbing material is included in the supporting layer of the film which is deposited on the display panel including the white photoresist. Case 6 is an instance wherein a film of which transmittance is 70% is deposited on the display panel as illustrated in FIG. 10B, as an embodiment wherein the light absorbing material is included in the supporting layer of the film which is deposited on the display panel including the white photoresist.

[Table 1]
Reflectance of External Light According to Attachment of Film and Ingredient of Light Absorbing Material.

|  | Case 1 | Case 2 | Case 3 | Case 4 | Case 5 | Case 6 |
| --- | --- | --- | --- | --- | --- | --- |
| 550 nm Wavelength | 15.6 | 13.6 | 10.4 | 8.7 | 9.3 | 8.6 |
| Average | 18.6 | 15.7 | 12.3 | 10.6 | 12.0 | 11.1 |

As shown in Table 1, the transmittance of the film may be controlled according to content of the dye which is the light absorbing material, and the lower the transmittance is, the higher the content of the dye may be.

In the embodiment of the invention, in order to reduce the reflectance of the display panel where the polarizing plate is removed, a low reflective metal is deposited on line and light shield areas and the white photoresist is coated, thereby implementing a low reflective display panel. Furthermore, the white photoresist (i.e. bluish, reddish or greenish dye) of which transmittance is controlled is deposited in the white subpixel area of the opening portion, thereby reducing 75% of reflectance to 24% or below of reflectance.

In addition, in order to reduce the reflection of the cathode between the line areas of the non-opening portion, the white photoresist is deposited on an area other than a storage capacitance area of the non-opening portion, thereby reducing the reflectance of the panel to about 8%.

The light transmittance controlling film having the reflection-prevention function is attached on a front surface of the panel on which the white photoresist is coated, thereby compensating for a color sense of a whole panel and reducing the reflectance by 10% or more.

When the transmittance of the light transmittance controlling film shown in Table 1 is somewhat increased, the reflectance may be calculated as noted in Table 2. When the transmittance of the film is increased by 5 to 10% compared to the transmittance of the film shown in Table 1, a luminance of light emitted from the display panel may be increased. The transmittance of the film may be selected by trading off light efficiency of the display panel and the low reflectance to be implemented in the display panel.

[Table 2]
Reflectance of External Light According to Attachment of Film and Ingredient of Light Absorbing Material.

| Reflectance (%) | Remove polarizing plate in prior panel | In an instance where only white photoresist is applied to low reflective panel | In an instance where both white photoresist and film are applied to low reflective panel |
| --- | --- | --- | --- |
| 550 nm | 39.4 | 18.8 | 8.8 |
| Average | 39.0 | 21.6 | 11.7 |

As noted in Table 1 and Table 2, a color photoresist (e.g., white photoresist) reducing the reflectance of the external light from the cathode electrode is deposited in the white subpixel area among color filters of the four subpixels (i.e. White, Red, Green and Blue (WRGB)) forming each pixel in the display device. In addition, the film is attached on the display device where the white photoresist is applied, and thus the reflection of the external light is reduced. The light transmittance is controlled using the light transmittance controlling film as a type of the film, and the light absorbing material is included in the supporting layer or the adhesive among the material forming the film to absorb the external light. The white photoresist of the embodiment of the invention is not limited to a specific color or material. When the color filters are formed in RGB colors, the white photoresist may be the photoresist having the color, such as the bluish color, reddish color and greenish color, lighter than one among the RGB colors as described above, but the embodiment of the invention is not limited thereto, and various colors of photoresists may be applied to the white photoresist of the embodiment of the invention. The embodiment of the invention is not limited to a specific transistor structure. The embodiment of the invention includes all embodiments wherein a material for the low reflection is spread in an area where the external light is reflected by a metal material such as a line or an electrode incurring the reflection of the external light. As an embodiment for deposing the low reflective material, the low reflective material may be comprehensively spread in a reflection area of the external light. Alternatively, the low reflective material is deposited using a mask forming each line and electrode, and then the line and the electrode may be formed on the low reflective material.

When the embodiment of the invention is applied, the material (e.g., low reflective metal) for the low reflection is deposited in the external light reflection area, such as the line, the electrode and the light shield layer of the panel where the polarizing plate or the polarizing film is removed, and the white photoresist is coated so that one type of color filter is deposited in the white subpixel area and the reflection area of the non-opening portion, thereby implementing the low reflective panel of which the transmittance of the reflective light is reduced. In addition, the light transmittance controlling film having the reflection-prevention function is attached, thereby compensating for a color sense of a whole panel and reducing the reflectance by 10% or more. Furthermore, the polarizing plate is removed, thereby increasing the luminance of a product and reducing a cost of the product.

The white photoresist is deposited on areas other than the storage capacitance area so as to eliminate the reflection by the cathode, the electrode, the line and the like, and thereby the reflectance of the light generated in the non-opening portion can be reduced.

For example, the low reflective material may include MoTi, Mo, etc. More specifically, as an embodiment, the low reflective material may include MoTi, and as another embodiment, the low reflective material may include an alloy having at least one of Mo, Ti, Zr, Hf, Ta, Cr, W, V, Nb, Mn, fe, Co, Ni, Cu, Zn, Ag, Al and Au.

Figure 11:
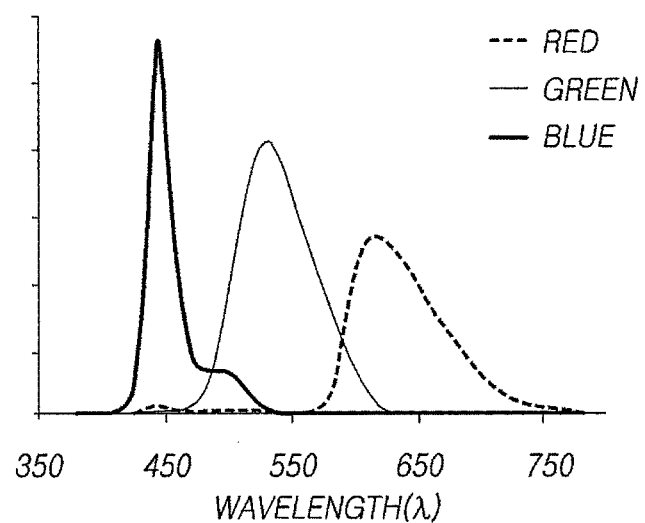
FIG. 11 is a view illustrating wavelength bands of three kinds of RGB colors.

FIG. 11 is a view illustrating wavelengths of three kinds of RGB colors. A wavelength band of a blue light may be 400 nm to 460 nm, a wavelength band of a red light may be 551 nm to 660 nm, and a wavelength band of a green light may be 461 nm to 550 nm.

The non-transparent photoresist disclosed in the embodiment of the invention may transmit light of which a wavelength band is wider than that of light transmitted by the photoresist formed in the non-white subpixel area. That is, the light of which the wavelength band is wider than the above-mentioned specific wavelength band is transmitted, and thus visibility is not distorted and the reflected external light can be absorbed by the light RGB colors.

More specifically, as an embodiment of the non-transparent photoresist of the embodiment of the invention, when the non-transparent photoresist transmits light of which a wavelength band is wider than 551 nm to 660 nm which is a wavelength band of the red light transmitted by the red photoresist, the non-transparent photoresist may be a reddish white photoresist. In addition, when the non-transparent photoresist transmits light of which a wavelength band is wider than 400 nm to 460 nm which is a wavelength band of the blue light transmitted by the blue photoresist, the non-transparent photoresist may be a bluish white photoresist. The reddish or bluish white photoresist may be formed in the display panel by changing a material or a process such as making a light material from the conventional red and blue color filters or reducing a thickness of a spread material.

When the non-transparent photoresist made by diluting a color of any color filter is used, a processing cost can be reduced. In addition, when the display panel is biased to a specific color, the non-transparent photoresist which can compensate for the biasing is spread, thereby improving visibility.

Figure 12:
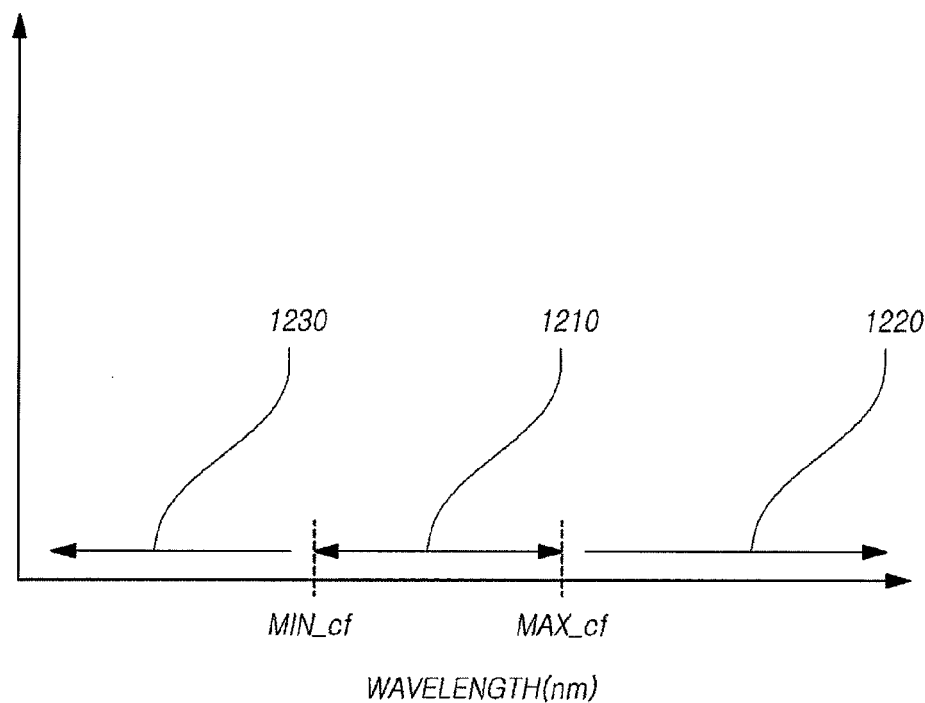
FIG. 12 is a view illustrating a range of the wavelength band of light transmitted by a non-transparent photoresist according to an embodiment of the invention.

FIG. 12 is a view illustrating a range of the wavelength band of the light transmitted by the non-transparent photoresist according to an embodiment of the invention.

For example, the range of the wavelength band of the light transmitted by the non-transparent photoresist may be set to min_cf nm to max_cf nm as indicated by reference numeral 1210 of FIG. 12. At this time, a range of the value of the min_cf or the max_cf may be varied according to whether the non-transparent photoresist is reddish or bluish.

As an embodiment, when the non-transparent photoresist is bluish in color, a wavelength band wider than that of the blue color may be included, the min_cf is equal to or smaller than 400, the max_cf is equal to or larger than 460, and thus the non-transparent photoresist may perform a function of a color filter transmitting light of which a wavelength band is expanded to a range including at least one of areas indicated by reference numerals 1220 and 1230. The non-transparent photoresist transmits light including a blue light and light of which a wavelength band is different from that of the blue light. Thus, the non-transparent photoresist transmits light blue light, thereby increasing low reflection and visibility.

As another embodiment, when the non-transparent photoresist is reddish in color, a wavelength band wider than that of the red color may be included, the min_cf is equal to or smaller than 551, the max_cf is equal to or larger than 650, and thus the non-transparent photoresist may perform a function of a color filter transmitting light of which a wavelength band is expanded to a range including at least one of areas indicated by reference numerals 1220 and 1230. The non-transparent photoresist transmits light including a red light and light of which a wavelength band is different from that of the red light. Thus, the non-transparent photoresist transmits light red light, thereby increasing low reflection and visibility.

The display panel to which the above-mentioned embodiments of the invention are applied absorbs the non-polarized external light because the non-transparent photoresist is positioned in the TFT area and the white subpixel area. The photoresist forming the RGB color filters is formed in non-white of red, green and blue subpixel areas, and the non-transparent photoresist is also formed in the white subpixel area and the TFT area in a process of forming the color filter. Thus, the non-transparent photoresist may be formed in the white subpixel area and the TFT area using one mask. The display panel of the embodiment of the invention described with reference to FIGS. 1 and 5, includes the plurality of data lines and the plurality of gate lines, a plurality of thin film transistors formed due to an intersection of the data line and the gate line, wherein a non-transparent photoresist is positioned on the thin film transistor, the white pixel electrode connected to a source electrode or a drain electrode of the thin film transistor and positioned in the white subpixel area where the non-transparent photoresist is positioned, wherein the white pixel electrodes face each white subpixel area, the non-white pixel electrode connected to the source electrode or the drain electrode of the thin film transistor and positioned in the non-white subpixel area where one of red, green and blue photoresists is positioned, wherein the non-white pixel electrodes face each non-white subpixel area, and the organic light emitting layer facing the white pixel electrode and the non-white pixel electrode.

In addition, the display panel may further include the film having the light absorbing layer which absorbs the external light and is formed in the adhesive or the supporting layer, as described above. The film absorbs the external light which is not absorbed in the non-transparent photoresist, thereby inducing the low reflection of the external light.

While the technical spirit of the embodiment of the invention has been described with reference to the accompanying drawings by example, it will be understood by a person skilled in the art that the embodiment of the invention may be varied and modified in various forms without departing from the scope of the embodiment of the invention. Accordingly, the embodiments disclosed in the invention are merely to not limit but describe the technical spirit of the embodiment of the invention. Further, the scope of the technical spirit of the invention is limited by the embodiments. The scope of the embodiments of the invention shall be construed on the basis of the accompanying claims in such a manner that all of the technical ideas included within the scope equivalent to the claims belong to the embodiment of the invention.

What is claimed is:

1. A display panel, comprising:
   a substrate having a thin film transistor (TFT) area having a plurality of thin film transistors (TFTs), and a pixel area having a plurality of subpixels that correspond to the plurality of thin film transistors;

a plurality of color filters respectively formed in each area of the plurality of subpixels, the plurality color filters comprising each of red color (R), green color (G), blue color (B) and white color; and a white photoresist formed in a subpixel area of the white color filter, and formed to cover the TFT area, wherein the white photoresist is one of a reddish white photoresist, a bluish white photoresist, or a greenish white photoresist.

2. The display panel of claim 1, wherein the TFT area further comprises lines and electrodes to supply voltages to the plurality of TFTs, and wherein at least one of the group of lines and the electrode is a multi-layer structure including a low reflective material.

3. The display panel of claim 2, wherein the low reflective material includes at least one of the group of a light absorbing metal, a metal oxide including the light absorbing metal, and an alloy of metals including the light absorbing metal.

4. The display panel of claim 1, wherein the white photoresist transmits light of which a wavelength band is wider than that of light transmitted by the respective RGB color filters.

5. The display panel of claim 1, wherein the white photoresist is non-transparent.

6. The display panel of claim 1, further comprising a film disposed on a surface of the substrate opposite from the plurality of color filters, the film including a light absorbing layer that absorbs both incident external light and reflected external light.

7. The display panel of claim 6, wherein the film comprises:

a supporting layer; and an adhesive layer on the supporting layer, wherein the light absorbing layer is included in the adhesive layer or the supporting layer.

8. The display panel of claim 7, wherein the light absorbing layer includes at least one of the group of a material including nano particles, a non-transparent dye material and a photoresist material.

9. A display panel comprising:

a plurality of data lines and a plurality of gate lines;

a thin film transistor having a source electrode and a drain electrode, and formed at an intersection of at least one of the plurality of data lines and at least one of the plurality of gate lines;

a white photoresist positioned on the thin film transistor;

a white pixel electrode connected to the source electrode or the drain electrode of the thin film transistor and positioned in a white subpixel area where the white photoresist is positioned, wherein the white pixel electrode faces the white subpixel area; and a non-white pixel electrode connected to the source electrode or the drain electrode of the thin film transistor and positioned in a non-white subpixel area where one of red, green and blue photoresists is positioned, wherein the non-white pixel electrode face the non-white subpixel area, wherein the white photoresist is one of a reddish white photoresist, a bluish white photoresist, or a greenish white photoresist.

10. The display panel of claim 9, wherein at least one of the group of plurality of data lines, the plurality of gate lines, and the thin film transistor includes a multi-layer structure including a low reflective material.

11. The display panel of claim 10, wherein the low reflective material includes at least one of the group of a light absorbing metal, a metal oxide including the light absorbing metal, and an alloy of metals including the light absorbing metal.

12. The display panel of claim 9, wherein the white photoresist transmits light of which a wavelength band is wider than that of light transmitted by the respective RGB photoresists.

13. The display panel of claim 9, further comprising a film disposed on a surface of a substrate opposite from the non-white pixel electrode, the film including a light absorbing layer that absorbs both incident external light and reflected external light.

14. The display panel of claim 13, wherein the film comprises:

a supporting layer; and an adhesive layer on the supporting layer, wherein the light absorbing layer is included in the adhesive layer or the supporting layer.

15. The display panel of claim 14, wherein the light absorbing layer includes at least one of the group of a material including nano particles, a non-transparent dye material and a photoresist material.

* * * * *